United States Patent
Epperson et al.

(10) Patent No.: US 10,605,832 B2
(45) Date of Patent: Mar. 31, 2020

(54) SENSOR SUBSYSTEMS FOR NON-CONTACT VOLTAGE MEASUREMENT DEVICES

(71) Applicant: Fluke Corporation, Everett, WA (US)

(72) Inventors: David L. Epperson, Spokane, WA (US); Ronald Steuer, Hinterbrühl (AT); Jeffrey Worones, Seattle, WA (US); Patrick Scott Hunter, Seattle, WA (US); Ricardo Rodriguez, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 204 days.

(21) Appl. No.: 15/695,998

(22) Filed: Sep. 5, 2017

(65) Prior Publication Data

US 2018/0136259 A1     May 17, 2018

Related U.S. Application Data

(60) Provisional application No. 62/421,124, filed on Nov. 11, 2016.

(51) Int. Cl.
    *G01R 15/16*     (2006.01)
    *G01R 19/28*     (2006.01)
    (Continued)

(52) U.S. Cl.
    CPC .............. *G01R 15/16* (2013.01); *G01R 1/22* (2013.01); *G01R 15/14* (2013.01); *G01R 15/142* (2013.01);
    (Continued)

(58) Field of Classification Search
    CPC .......... G01R 15/16; G01R 19/00; G01R 1/22; G01R 15/14; G01R 15/142; G01R 15/20; G01R 19/165; G01R 19/28
    (Continued)

(56) References Cited

U.S. PATENT DOCUMENTS

| | | |
|---|---|---|
| 5,473,244 A | 12/1995 | Libove et al. |
| 5,583,444 A | 12/1996 | Nakamura et al. |
| (Continued) | | |

FOREIGN PATENT DOCUMENTS

| | | |
|---|---|---|
| EP | 1 249 706 B1 | 9/2007 |
| JP | 2002-71726 A | 3/2002 |
| (Continued) | | |

OTHER PUBLICATIONS

HIOKI, "3258 : Safety HiTESTER," Revised Edition 5, HIOKI E. E. Corporation, Nagano Japan, 2 pages.

(Continued)

*Primary Examiner* — Farhana A Hoque
(74) *Attorney, Agent, or Firm* — Seed Intellectual Property Law Group LLP

(57) ABSTRACT

Systems and methods for measuring alternating current (AC) voltage of an insulated conductor are provided, without requiring a galvanic connection between the conductor and a test electrode. A non-galvanic contact voltage measurement device includes a conductive sensor, an internal ground guard, and a reference shield. A reference voltage source is electrically coupleable between the guard and the reference shield to generate an AC reference voltage which causes a reference current to pass through the conductive sensor. Sensor subsystems may be arranged in layers (e.g., stacked layers, nested layers, or components) of conductors and insulators. The sensor subsystems may be packaged as formed sheets, flexible circuits, integrated circuit (IC) chips, nested components, printed circuit boards (PCBs), etc. The sensor subsystems may be electrically coupled to suitable processing or control circuitry of a non-contact voltage measurement device to allow for measurement of voltages in insulated conductors.

20 Claims, 15 Drawing Sheets

(51) Int. Cl.
    *G01R 19/165* (2006.01)
    *G01R 15/20* (2006.01)
    *G01R 1/22* (2006.01)
    *G01R 15/14* (2006.01)
    *G01R 19/00* (2006.01)

(52) U.S. Cl.
    CPC ............ *G01R 15/20* (2013.01); *G01R 19/00* (2013.01); *G01R 19/165* (2013.01); *G01R 19/28* (2013.01)

(58) Field of Classification Search
    USPC ............................................. 324/202, 207.16
    See application file for complete search history.

(56) References Cited

U.S. PATENT DOCUMENTS

| | | | |
|---|---|---|---|
| 5,973,501 | A | 10/1999 | Reichard |
| 6,014,027 | A | 1/2000 | Reichard |
| 6,043,640 | A | 3/2000 | Lauby et al. |
| 6,118,270 | A | 9/2000 | Singer et al. |
| 6,664,708 | B2 | 12/2003 | Schlimak et al. |
| 6,812,685 | B2 | 11/2004 | Steber et al. |
| 6,825,649 | B2 | 11/2004 | Nakano |
| 7,084,643 | B2 | 8/2006 | Howard et al. |
| 7,466,145 | B2 | 12/2008 | Yanagisawa |
| 8,054,061 | B2 | 11/2011 | Prance et al. |
| 8,222,886 | B2 | 7/2012 | Yanagisawa |
| 8,680,845 | B2 | 3/2014 | Carpenter et al. |
| 8,803,506 | B2 | 8/2014 | Yanagisawa |
| 9,063,184 | B2 | 6/2015 | Carpenter et al. |
| 9,201,100 | B2 | 12/2015 | Yanagisawa |
| 2002/0167303 | A1 | 11/2002 | Nakano |
| 2009/0058398 | A1 | 3/2009 | Ibuki |
| 2009/0058399 | A1 | 3/2009 | Wang et al. |
| 2010/0060300 | A1* | 3/2010 | Muller ................. A61B 5/0408 324/686 |
| 2010/0090682 | A1 | 4/2010 | Armstrong |
| 2010/0283539 | A1 | 11/2010 | Yanagisawa |
| 2012/0200291 | A1* | 8/2012 | Carpenter ................. G01R 1/22 324/252 |
| 2013/0076343 | A1 | 3/2013 | Carpenter et al. |
| 2013/0124136 | A1 | 5/2013 | Neeley et al. |
| 2015/0108967 | A1* | 4/2015 | Barczyk ............... G01R 15/185 324/202 |
| 2016/0080667 | A1 | 3/2016 | Stuart et al. |
| 2016/0109486 | A1 | 4/2016 | Yanagisawa |
| 2016/0119592 | A1* | 4/2016 | Stuart ..................... H04N 5/33 348/82 |

FOREIGN PATENT DOCUMENTS

| | | |
|---|---|---|
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2016-3997 A | 1/2016 |

OTHER PUBLICATIONS

Huber et al., "Non-Contact Voltage Measurement Systems," U.S. Appl. No. 62/421,124, filed Nov. 11, 2016, 122 pages.

Mitchell Instrument Company Inc., clipping from the Mitchell Catalogue, undated, 1 page.

Neeley et al., "Maintenance Management Systems and Methods," U.S. Appl. No. 61/514,842, filed Aug. 3, 2011, 22 pages.

Ringsrud et al., "Non-Contact Voltage Measurement System," U.S. Appl. No. 15/345,256, filed Nov. 7, 2016, 39 pages.

Rodriguez et al., "Non-Contact Current Measurement System," U.S. Appl. No. 15/604,320, filed May 24, 2017, 66 pages.

Steuer et al., "Non-Contact Electrical Parameter Measurement Systems," U.S. Appl. No. 15/625,745, filed Jun. 16, 2017, 130 pages.

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

Stuart et al., "Combined Use of Digital Multimeter and Infrared Camera to Analyze and Diagnose Issues With Voltage Drop and Impedance," U.S. Appl. No. 62/051,930, filed Sep. 17, 2014, 3 pages.

Stuart et al., "Imaging System Employing Fixed, Modular Mobile, and Portable Infrared Cameras With Ability to Receive, Communicate, and Display Data and Images With Proximity Detection," U.S. Appl. No. 62/068,392, filed Oct. 24, 2014, 9 pages.

Stuart et al., "Infrared Cameras Used as a Method to Trigger Operation and/or Recording of Test and Measurement Devices," U.S. Appl. No. 62/076,088, filed Nov. 6, 2014, 14 pages.

Takahashi, "Clamp on Power Logger PW3365 : Safety Voltage Sensor PW9020," *HIOKI Technical Notes* 1(1): 2015, 8 pages.

Tsang et al., "Dual capacitive sensors for non-contact AC voltage measurement," *Sensors and Actuators A* 167:261-266, 2011.

* cited by examiner

SENSOR SUBSYSTEMS FOR NON-CONTACT VOLTAGE MEASUREMENT DEVICES

BACKGROUND

Technical Field

The present disclosure generally relates to measurement of electrical characteristics, and more particularly, to non-contact measurement of alternating current (AC) voltage.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution.

A non-contact voltage detector is commonly used to detect the presence of alternating current (AC) voltage, typically high voltage, without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

Thus, there is a need for an AC voltage measurement system which provides convenient and accurate voltage measurements without requiring galvanic contact with the circuit being tested.

BRIEF SUMMARY

A sensor subsystem for a voltage measurement device operative to measure alternating current (AC) voltage in an insulated conductor may be summarized as including a conductive sensor disposed within a housing of the voltage measurement device, the conductive sensor selectively positionable proximate the insulated conductor without galvanically contacting the conductor, wherein the conductive sensor capacitively couples with the insulated conductor; a conductive internal ground guard disposed within the housing, wherein the internal ground guard at least partially surrounds the conductive sensor and is galvanically isolated from the conductive sensor, the internal ground guard sized and dimensioned to shield the conductive sensor from stray currents; and a conductive reference shield which surrounds at least a portion of the housing and is galvanically insulated from the internal ground guard, the conductive reference shield sized and dimensioned to reduce currents between the internal ground guard and an external ground. The conductive internal ground guard and the conductive reference shield may be electrically coupleable to a common mode reference voltage source which, in operation, may generate an alternating current (AC) reference voltage having a reference frequency. The conductive sensor and the conductive internal ground guard may be disposed in layers of a multi-layered circuit. The conductive sensor and the conductive internal ground guard may be disposed in a single layer of a multi-layered circuit. The conductive sensor, the conductive internal ground guard, and the conductive reference shield may be disposed in layers of a multi-layered flexible circuit. At least one of the conductive sensor, conductive internal ground, or conductive reference shield may include conductive tape, a conductive sheet, a conductive plate, or a cured liquid.

The sensor subsystem may further include an insulation layer disposed between the conductive sensor and the conductive internal ground guard. The insulation layer may include plastic, silicon, or ceramic.

The sensor subsystem may further include a high permittivity material disposed above the conductive sensor. The conductive reference shield may be molded into at least a portion of the housing of the voltage measurement device. The conductive sensor and the internal ground guard may be arranged as one of stacked layers or nested components. At least a portion of the sensor subsystem may include formed sheets, a flexible circuit, an integrated circuit chip, nested components, or a printed circuit board. The sensor subsystem may include at least one of a non-contact current sensor, an infrared sensor, an indicator, or an illumination source.

A sensor subsystem for a voltage measurement device operative to measure alternating current (AC) voltage in an insulated conductor may be summarized as including a multi-layered flexible circuit, including: a sensor/guard layer including a conductive sensor portion and a guard portion galvanically isolated from the conductive sensor portion; and a reference shield layer that is galvanically isolated from the sensor/guard layer, wherein the guard portion of the sensor/guard layer and the reference shield layer are electrically coupleable to a common mode reference voltage source which, in operation, generates an alternating current (AC) reference voltage having a reference frequency. The multi-layered flexible circuit may be foldable into a custom shape and, when in the custom shape, the multi-layered flexible circuit may be positionable within a housing of a voltage measurement device.

The sensor subsystem may further include at least one of a non-contact current sensor, an infrared sensor, an indicator, or an illumination source coupled to the multi-layered flexible circuit.

The sensor subsystem may further include at least one of a Rogowski coil, a fluxgate sensor, or a Hall Effect sensor coupled to the multi-layered flexible circuit.

The sensor subsystem may further include a shielding layer disposed above the sensor/guard layer, the shielding layer having an opening therein that is aligned with the conductive sensor portion of the sensor/guard layer, wherein the shielding layer is galvanically isolated from any conductive components of the sensor subsystem.

A sensor subsystem for a voltage measurement device operative to measure alternating current (AC) voltage in an insulated conductor may be summarized as including a housing including an opening that defines a first interior volume; a guard insulator disposed within the first interior volume of the housing, the guard insulator including an opening that defines a second interior volume; a conductive guard disposed within the second interior volume of the guard insulator, the conductive guard including an opening that defines a third interior volume; a sensor insulator disposed within the third interior volume of the conductive guard, the sensor insulator including an opening that defines a fourth interior volume; and a conductive sensor disposed within the fourth interior volume of the sensor insulator.

The sensor subsystem may further include a printed circuit assembly electrically coupled to the conductive guard and the conductive sensor.

The sensor subsystem may further include a reference shield molded into the housing, wherein the conductive guard and the reference shield are electrically coupleable to a common mode reference voltage source which, in operation, generates an alternating current (AC) reference voltage having a reference frequency.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1A:
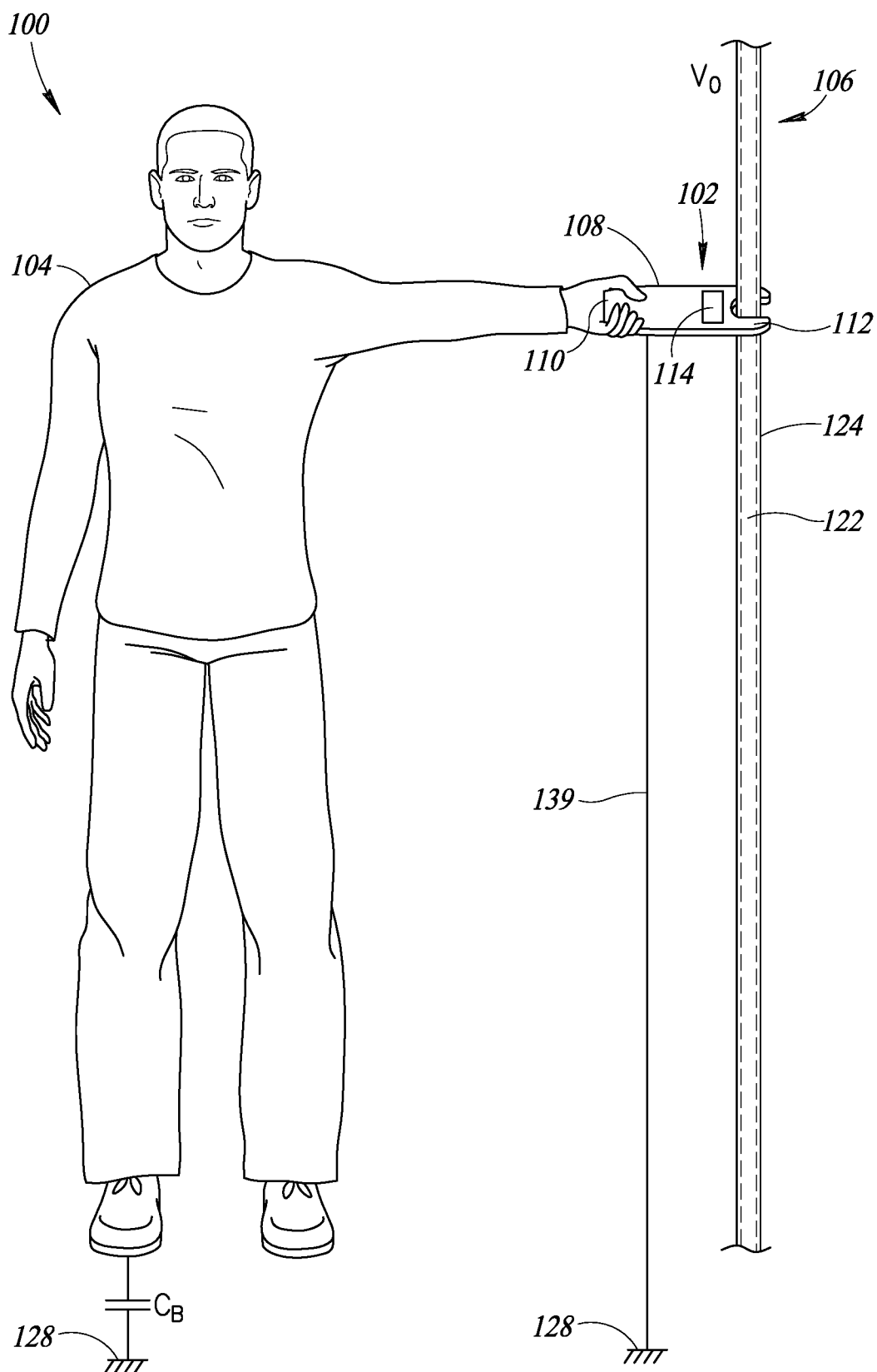
FIG. 1A is a pictorial diagram of an environment in which a non-contact voltage measurement device may be used by an operator to measure AC voltage present in an insulated wire without requiring galvanic contact with the wire, according to one illustrated implementation.

Systems and methods of the present disclosure are directed to sensor subsystems for non-contact voltage measurement devices. The non-contact voltage measurement devices are operative to measure alternating current (AC) voltage in an insulated (e.g., insulated wire) or blank uninsulated conductor (e.g., bus bar) without requiring a galvanic connection between the conductor and a test electrode or probe. Generally, a non-galvanic contact (or "non-contact") voltage measurement device is provided which measures an AC voltage signal in an insulated conductor with respect to ground using a capacitive sensor. Such devices which do not require a galvanic connection are referred to herein as "non-contact." As used herein, "electrically coupled" includes both direct and indirect electrical coupling unless stated otherwise.

The sensor subsystems disclosed herein may include a coupled capacitor or "capacitive sensor," guarding and/or shielding, and a reference signal or voltage existing independently of each other. The components of the sensor subsystems discussed herein may be arranged in layers (e.g., stacked layers, nested layers) of conductors and insulators, for example. Each of the conductors may include any suitable types of conductor, such as conductive tape, conductive sheet, conductive plate, conductive cured liquid, etc. The insulators may include any suitable type of material that blocks an electrical charge, such as plastic, silicon, ceramic, etc. The insulation layer may be made of a high permittivity material disposed above the sensor to focus the field to the sensor, increasing sensitivity and reducing stray effects (see FIG. 16). The sensor subsystems may be packaged in any form, including formed sheets, one or more flexible circuits, one or more integrated circuit (IC) chips, nested components, printed circuit boards (PCBs), etc. The sensor subsystems may be electrically coupled to suitable processing or control circuitry of a non-contact voltage measurement device to allow for measurement of voltages in insulated conductors.

Initially, with reference to FIGS. 1A-4, examples of non-contact voltage measurement devices are discussed. Then, with reference to FIGS. 5-16, various examples of sensor subsystems for non-contact voltage measurement devices are discussed.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Figure 1B:
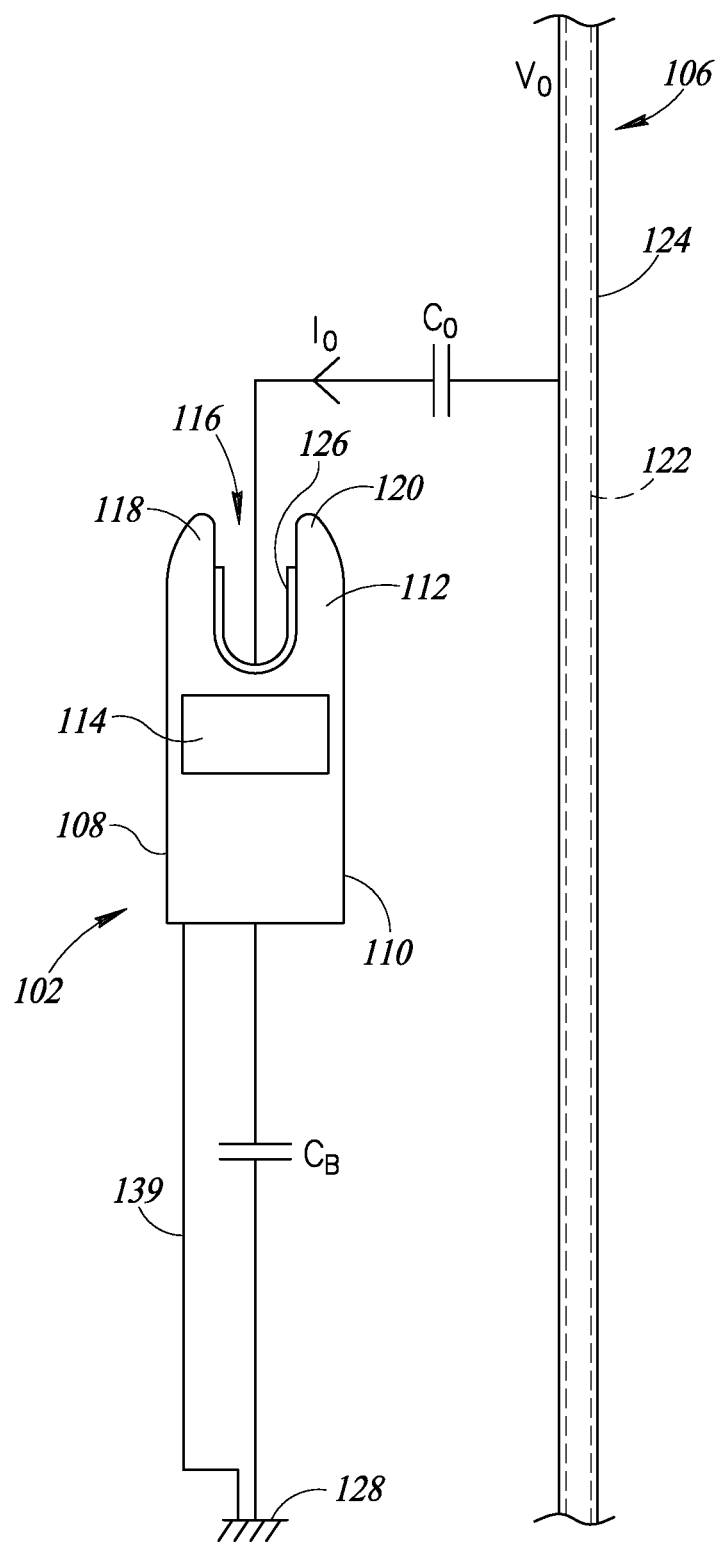
FIG. 1B is a top view of the non-contact voltage measurement device of FIG. 1A, showing a coupling capacitance formed between the insulated wire and a conductive sensor of the non-contact voltage measurement device, an insulated conductor current component, and a body capacitance between the non-contact voltage measurement device and the operator, according to one illustrated implementation.

FIG. 1A is a pictorial diagram of an environment 100 in which a non-contact voltage measurement device 102 of the present disclosure may be used by an operator 104 to measure AC voltage present in an insulated wire 106 without requiring galvanic contact between the non-contact voltage measurement device and the wire 106. FIG. 1B is a top plan view of the non-contact voltage measurement device 102 of FIG. 1A, showing various electrical characteristics of the non-contact voltage measurement device during operation. The non-contact voltage measurement device 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement device 102. The user interface 114 may include any number of inputs (e.g., buttons, dials, switches, touch sensor) and any number of outputs (e.g., display, LEDs, speakers, buzzers). The non-contact voltage measurement device 102 may also include one or more wired and/or wireless communications interfaces (e.g., USB, Wi-Fi®, Bluetooth®).

In at least some implementations, as shown best in FIG. 1B, the probe portion 112 may include a recessed portion 116 defined by first and second extended portions 118 and 120. The recessed portion 116 receives the insulated wire 106 (see FIG. 1A). The insulated wire 106 includes a conductor 122 and an insulator 124 surrounding the conductor 122. The recessed portion 116 may include a sensor or electrode 126 which rests proximate the insulator 124 of the insulated wire 106 when the insulated wire is positioned within the recessed portion 116 of the non-contact voltage measurement device 102. Although not shown for clarity, the sensor 126 may be disposed inside of the housing 108 to prevent physical and electrical contact between the sensor and other objects.

As shown in FIG. 1A, in use the operator 104 may grasp the grip portion 110 of the housing 108 and place the probe portion 112 proximate the insulated wire 106 so that the non-contact voltage measurement device 102 may accurately measure the AC voltage present in the wire with respect to earth ground (or another reference node). Alternatively a direct connection to earth ground 128, such as via a test lead 139, can be used. Although the probe end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor of the non-contact voltage measurement device 102 to be positioned proximate the insulated wire 106. Examples of various sensor subsystems are discussed below with reference to FIGS. 5-16.

The operator's body acting as a reference to earth/ground may only be used in some implementations. The non-contact measurement functionality discussed herein is not limited to applications only measuring against earth. The outside reference may be capacitively coupled to any other potential. For example, if the outside reference is capacitively coupled to another phase in three phase systems, the phase-to-phase voltages are measured. In general, the concepts discussed herein are not limited to reference against earth only using a body capacitive coupling connected to a reference voltage and any other reference potential.

As discussed further below, in at least some implementations, the non-contact voltage measurement device 102 may utilize the body capacitance ($C_B$) between the operator 104 and ground 128 during the AC voltage measurement. Although the term ground is used for the node 128, the node is not necessarily earth/ground but could be connected in a galvanically isolated manner to any other reference potential by capacitive coupling.

The particular systems and methods used by the non-contact voltage measurement device 102 to measure AC voltage are discussed below with reference to FIGS. 2-4.

Figure 2:
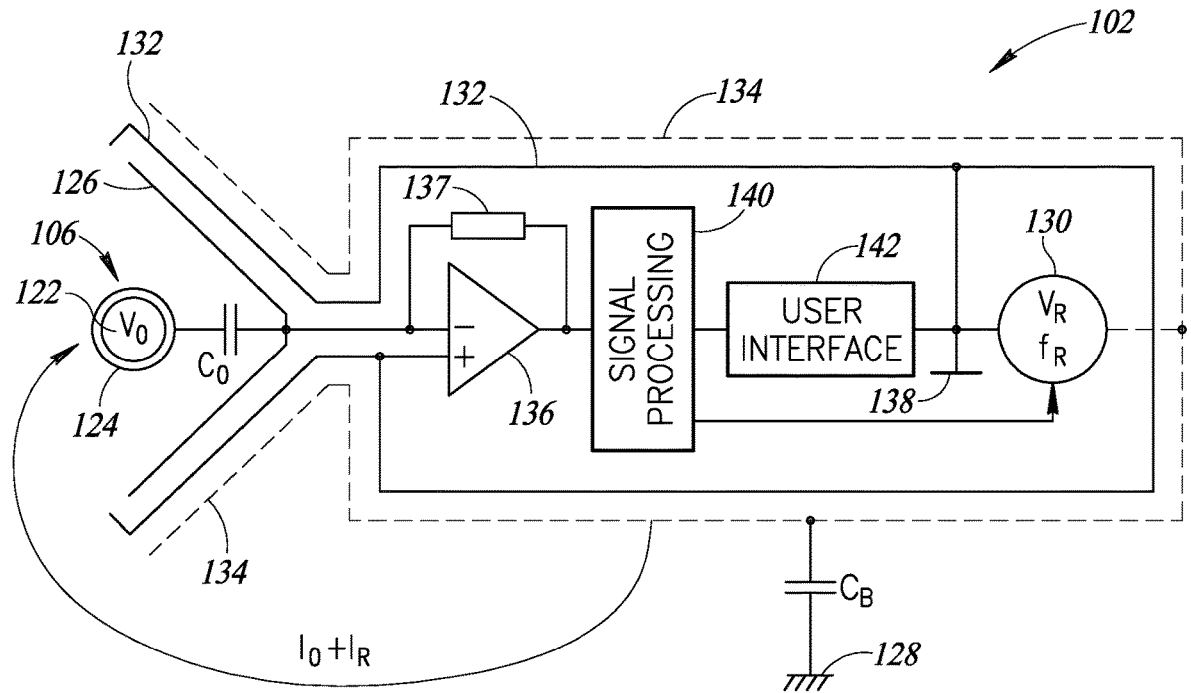
FIG. 2 is a schematic diagram of various internal components of a non-contact voltage measurement device, according to one illustrated implementation.

FIG. 2 shows a schematic diagram of various internal components of the non-contact voltage measurement device 102, also shown in FIGS. 1A and 1B. In this example, the conductive sensor 126 of the non-contact voltage measurement device 102 is substantially "V-shaped" and is positioned proximate the insulated wire 106 under test and capacitively couples with the conductor 122 of the insulated wire 106, forming a sensor coupling capacitor ($C_O$). The operator 104 handling the non-contact voltage measurement device 102 has a body capacitance ($C_B$) to ground. Thus, as shown in FIGS. 1B and 2, the AC voltage signal ($V_O$) in the wire 122 generates an insulated conductor current component or "signal current" ($I_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential.

The AC voltage ($V_O$) in the wire 122 to be measured has a connection to an external ground 128 (e.g., neutral). The non-contact voltage measurement device 102 itself also has a capacitance to ground 128, which consists primarily of the body capacitance ($C_B$) when the operator 104 (FIG. 1) holds the non-contact voltage measurement device in his hand. Both capacitances $C_O$ and $C_B$ create a conductive loop for AC and the voltage inside the loop generates the signal current ($I_O$). The signal current ($I_O$) is generated by the AC voltage signal ($V_O$) capacitively coupled to the conductive sensor 126 and loops back to the external ground 128 through the housing 108 of the non-contact voltage measurement device and the body capacitor ($C_B$) to ground 128. The current signal ($I_O$) is dependent on the distance between the conductive sensor 126 of the non-contact voltage measurement device 102 and the insulated wire 106 under test, the particular shape of the conductive sensor 126, and the size and voltage level ($V_O$) in the conductor 122.

To compensate for the distance variance and consequent coupling capacitor ($C_O$) variance which directly influences the signal current ($I_O$), the non-contact voltage measurement device 102 includes a common mode reference voltage source 130 which generates an AC reference voltage ($V_R$) which has a reference frequency ($f_R$).

To reduce or avoid stray currents, at least a portion of the non-contact voltage measurement device 102 may be surrounded by a conductive internal ground guard or screen 132 which causes most of the current to run through the conductive sensor 126 which forms the coupling capacitor ($C_O$) with the conductor 122 of the insulated wire 106. The internal ground guard 132 may be formed from any suitable conductive material (e.g., copper) and may be solid (e.g. sheet metal, sputtered metal inside plastic enclosure), flexible (e.g., foil), or have one or more openings (e.g., mesh).

Further, to avoid currents between the internal ground guard 132 and the external ground 128, the non-contact voltage measurement device 102 includes a conductive reference shield 134. The reference shield 134 may be formed from any suitable conductive material (e.g., copper) and may be solid (e.g. sheet metal, sputtered metal inside plastic enclosure), flexible (e.g., foil), or have one or more openings (e.g., mesh). In at least some implementations, the reference shield 134 may be positioned within the housing of the voltage measurement device, for example, molded into at least a portion of the housing. The common mode reference voltage source 130 is electrically coupled between the reference shield 134 and the internal ground guard 132, which creates a common mode voltage having the reference voltage ($V_R$) and the reference frequency ($f_R$) for the non-contact voltage measurement device 102. Such AC reference voltage ($V_R$) drives an additional reference current ($I_R$) through the coupling capacitor ($C_O$) and the body capacitor ($C_B$).

The internal ground guard 132 which surrounds at least a portion of the conductive sensor 126 protects the conductive sensor against direct influence of the AC reference voltage ($V_R$) causing an unwanted offset of reference current ($I_R$) between the conductive sensor 126 and the reference shield 134. As noted above, the internal ground guard 132 is the internal electronic ground 138 for the non-contact voltage measurement device 102. In at least some implementations, the internal ground guard 132 also surrounds some or all of the electronics of the non-contact voltage measurement device 102 to avoid the AC reference voltage ($V_R$) coupling into the electronics.

As noted above, the reference shield 134 is utilized to inject a reference signal onto the input AC voltage signal ($V_O$) and, as a second function, minimizes the guard 132 to earth ground 128 capacitance. In at least some implementations, the reference shield 134 surrounds some or all of the housing 108 of the non-contact voltage measurement device 102. In such implementations, some or all of the electronics see the reference common mode signal which also generates the reference current ($I_R$) between the conductive sensor 126 and the conductor 122 in the insulated wire 106. In at least some implementations, the only gap in the reference shield 134 may be an opening for the conductive sensor 126 which allows the conductive sensor to be positioned proximate the insulated wire 106 during operation of the non-contact voltage measurement device 102.

The internal ground guard 132 and the reference shield 134 may provide a double layer screen around the housing 108 (see FIGS. 1A and 1B) of the non-contact voltage measurement device 102. The reference shield 134 may be disposed on an outside surface of the housing 108 and the internal ground guard 132 may function as an internal shield or guard. The conductive sensor 126 is shielded by the guard 132 against the reference shield 134 such that any reference current flow is generated by the coupling capacitor ($C_O$) between the conductive sensor 126 and the conductor 122 under test. The guard 132 around the sensor 126 also reduces stray influences of adjacent wires close to the sensor.

As shown in FIG. 2, the non-contact voltage measurement device 102 may include an input amplifier 136 which operates as an inverting current-to-voltage converter. The input amplifier 136 has a non-inverting terminal electrically coupled to the internal ground guard 132 which functions as the internal ground 138 of the non-contact voltage measurement device 102. An inverting terminal of the input amplifier 136 may be electrically coupled to the conductive sensor 126. Feedback circuitry 137 (e.g., feedback resistor) may also be coupled between the inverting terminal and the output terminal of the input amplifier 136 to provide feedback and appropriate gain for input signal conditioning.

The input amplifier 136 receives the signal current ($I_O$) and reference current ($I_R$) from the conductive sensor 126 and converts the received currents into a sensor current voltage signal indicative of the conductive sensor current at the output terminal of the input amplifier. The sensor current voltage signal may be an analog voltage, for example. The analog voltage may be fed to a signal processing module 140 which, as discussed further below, processes the sensor current voltage signal to determine the AC voltage ($V_O$) in the conductor 122 of the insulated wire 106. The signal processing module 140 may include any combination of digital and/or analog circuitry.

The non-contact voltage measurement device 102 may also include a user interface 142 (e.g., display) communicatively coupled to the signal processing module 140 to present the determined AC voltage ($V_O$) or to communicate by an interface to the operator 104 of the non-contact voltage measurement device.

Figure 3:
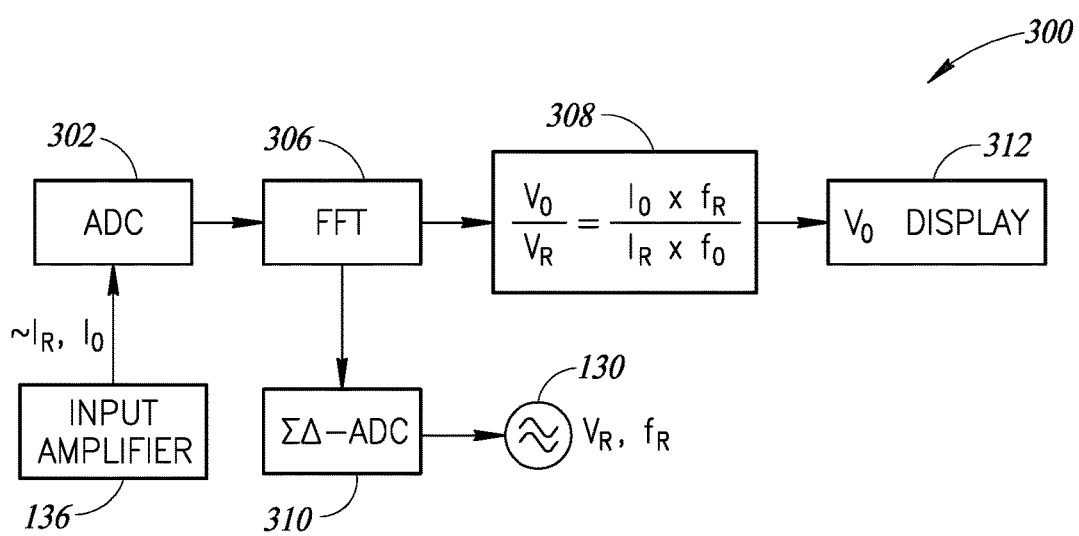
FIG. 3 is a block diagram which shows various signal processing components of a non-contact voltage measurement device, according to one illustrated implementation.
Figure 4:
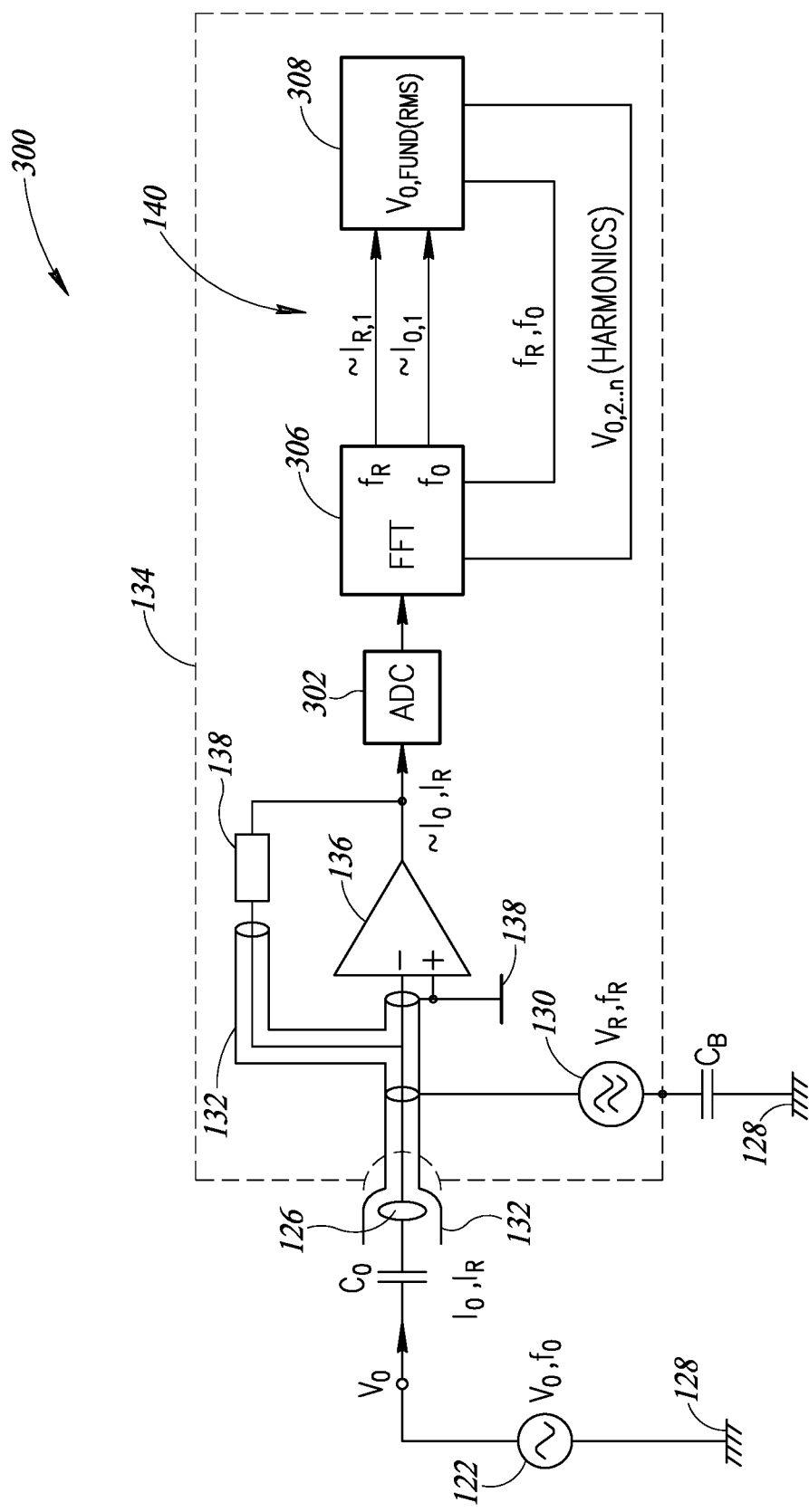
FIG. 4 is a schematic diagram of a non-contact voltage measurement device which implements a fast Fourier transform (FFT), according to one illustrated implementation.

FIG. 3 is a block diagram of a non-contact voltage measurement device 300 which shows various signal processing components of the non-contact voltage measurement device. FIG. 4 is a more detailed diagram of the non-contact voltage measurement device 300 of FIG. 3.

The non-contact voltage measurement device 300 may be similar or identical to the non-contact voltage measurement device 102 discussed above. Accordingly, similar or identical components are labeled with the same reference numerals. As shown, the input amplifier 136 converts the input current ($I_O+I_R$) from the conductive sensor 126 into a sensor current voltage signal which is indicative of the input current. The sensor current voltage signal is converted into digital form using an analog-to-digital converter (ADC) 302.

The AC voltage ($V_O$) in the wire 122 is related to the AC reference voltage ($V_R$) by Equation (1):

$$\frac{V_O}{V_R} = \frac{I_O \times f_R}{I_R \times f_O} \quad (1)$$

where ($I_O$) is the signal current through the conductive sensor 126 due to the AC voltage ($V_O$) in the conductor 122, ($I_R$) is the reference current through the conductive sensor 126 due to the AC reference voltage ($V_R$), ($f_O$) is the frequency of the AC voltage ($V_O$) that is being measured, and ($f_R$) is the frequency of the reference AC voltage ($V_R$).

Figure 5:
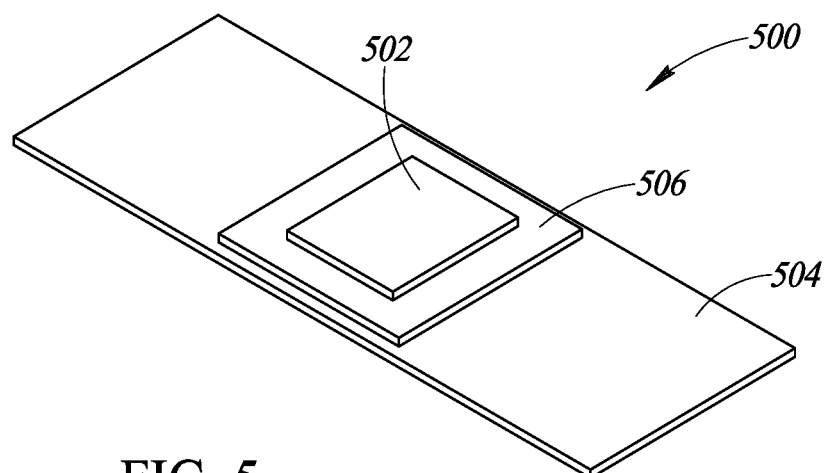
FIG. 5 is a perspective view of a sensor subsystem for a non-contact voltage measurement device that includes a conductive sensor and an internal ground guard assembly, according to one illustrated implementation.

The signals with indices "O," which are related to the AC voltage ($V_O$), have different frequencies than the signals with indices "R," which are related to the common mode reference voltage source 130. In the implementation of FIG. 4, digital processing, such as circuitry implementing a fast Fourier transform (FFT) algorithm 306, may be used to separate signal magnitudes. In the implementation of FIG. 5 discussed below, analog electronic filters may be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 122 under test needs either to be measured to determine the ratio of the reference frequency ($f_R$) to the signal frequency ($f_O$), which is utilized in Equation (1) listed above, or the reference frequency is already known because it is generated by the system itself.

After the input current ($I_O+I_R$) has been conditioned by the input amplifier 136 and digitized by the ADC 302, the frequency components of the digital sensor current voltage signal may be determined by representing the signal in the frequency domain using the FFT 306. When both of the frequencies ($f_O$) and ($f_R$) have been measured, frequency bins may be determined to calculate the fundamental magnitudes of the currents ($I_O$) and ($I_R$) from the FFT 306.

Next, as indicated by a block 308, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 122, which may be presented to the user on a display 312.

The coupling capacitor ($C_O$) may generally have a capacitance value in the range of approximately 0.02 pF to 1 pF, for example, depending on the distance between the insulated conductor 106 and the conductive sensor 126, as well as the particular shape and dimensions of the sensor 126. The body capacitance ($C_B$) may have a capacitance value of approximately 20 pF to 200 pF, for example.

From Equation (1) above, it can be seen that the AC reference voltage ($V_R$) generated by the common mode reference voltage source 130 does not need to be in the same range as the AC voltage ($V_O$) in the conductor 122 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 120 VRMS AC voltage ($V_O$) having a signal frequency ($f_O$) of 60 Hz. In such case, the AC reference voltage ($V_R$) may be selected to be only 2.4 V (i.e., 120 V÷50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 122 to produce currents ($I_R$) and ($I_O$) which are in the same range as each other to achieve a similar uncertainty for $I_R$ and $I_O$.

Any suitable signal generator may be used to generate the AC reference voltage ($V_R$) having the reference frequency ($f_R$). In the example illustrated in FIG. 3, a Sigma-Delta digital-to-analog converter (Σ-Δ DAC) 310 is used. The Σ-Δ DAC 310 uses a bit stream to create a waveform (e.g., sinusoidal waveform) signal with the defined reference frequency ($f_R$) and AC reference voltage ($V_R$). In at least some implementations, the Σ-Δ DAC 310 may generate a waveform that is in phase with the window of the FFT 306 to reduce jitter. Any other reference voltage generator can be used, such as a PWM which may use less computing power than a Σ-Δ DAC.

In at least some implementations, the ADC 302 may have 14 bits of resolution. In operation, the ADC 302 may sample the output from the input amplifier 136 at a sampling frequency of 10.24 kHz for nominal 50 Hz input signals to provide $2^n$ samples (1024) in 100 ms (10 Hz bins for the FFT 306) ready for processing by the FFT 306. For 60 Hz input signals, the sampling frequency may be 12.28 kHz, for example. The sampling frequency of the ADC 302 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 306 and use a Hanning window function for further calculations to suppress phase shift jitter caused by incomplete signal cycles captured in the aggregation interval.

In one example, the common mode reference voltage source 130 generates an AC reference voltage ($V_R$) which has a reference frequency ($f_R$) of 2419 Hz. This frequency is in between the 40$^{th}$ harmonic and the 41$^{st}$ harmonic for 60 Hz signals, and between the 48$^{th}$ harmonic and 49$^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 130 is selected to be a frequency that is least likely to be affected by harmonics of an AC voltage ($V_O$) in the conductor 122 under test. As an example, the common mode reference voltage source 130 may be switched off when the reference current ($I_R$) exceeds a limit, which may indicate that the conductive sensor 126 is approaching the conductor 122 under test. A measurement (e.g., 100 ms measurement) may be taken with the common mode reference voltage source 130 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results.

FIG. 5 is a perspective view of an example sensor and guard assembly or subsystem 500 for a non-contact voltage measurement device, such as any of the non-contact voltage measurement devices discussed above. In this example, the sensor and guard assembly 500 includes a conductive sensor 502, an internal ground guard 504, and an isolating layer 506 disposed between the sensor and the internal ground guard. Generally, the sensor assembly 500 should provide good coupling capacitance ($C_O$) between the sensor 502 and the wire under test and should suppress the capacitance to other adjacent wires and the capacitance to the external ground. The sensor assembly 500 should also minimize the capacitance ($C_{SENS-REF}$) between the sensor 502 and the reference shield (e.g., reference shield 134).

As a simple example, the sensor 502, guard 504 and isolating layer 506 may each comprise a piece of foil. The guard 504 may be coupled to a carrier (see FIG. 6), the isolating layer 506 (e.g., Kapton® tape) may be coupled to the guard, and the sensor 502 may be coupled to the isolating layer.

Figure 6:
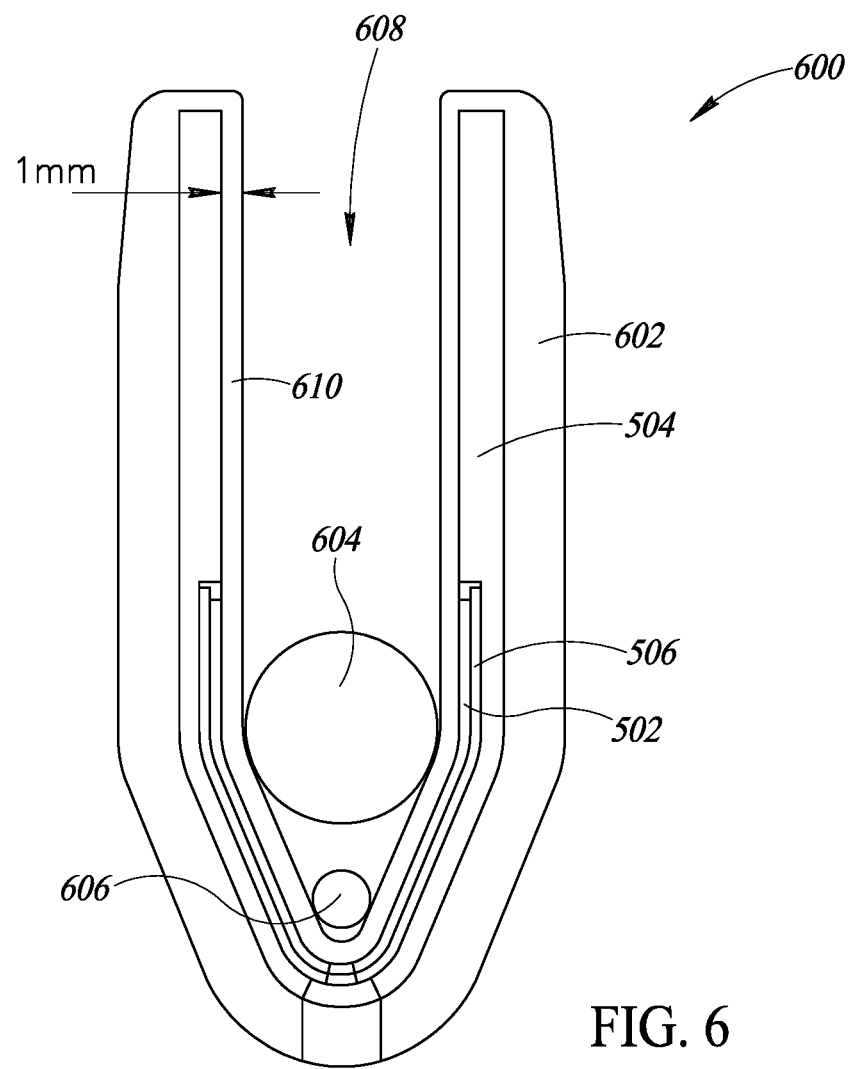
FIG. 6 is a sectional view of a "U" or "V" shaped sensor subsystem positioned in a front end of a non-contact voltage measurement device, according to one illustrated implementation.

FIG. 6 shows a sectional view of an example for a sensor realization of a probe or front end 600 of a non-contact voltage measurement device, which includes a housing layer 602 (e.g., plastic) which covers the sensor assembly 500 to avoid direct galvanic contact between the sensor assembly and any objects. The front end 600 may be similar or identical to the front end 112 of the non-contact voltage measurement device 102 shown in FIGS. 1A and 1B. In this illustration, the sensor assembly 500, including the sensor 502, guard 504 and isolating layer 506, are shaped in the form of a "U" or "V," to allow the sensor assembly 500 to surround insulated wires of different diameters, to increase the coupling capacitance ($C_O$), and to better shield, by the guard, against adjacent conductive objects. A reference shield (e.g., reference shield 134) may be disposed in the housing layer (e.g., molded therein) to surround at least a portion of the sensor 502 and guard 504, and/or other portions of the voltage measurement device.

In the example shown in FIG. 6, the sensor assembly 500 is shaped to accommodate insulated wires of various diameters, such as an insulated wire 604 with a relatively large diameter or an insulated wire 606 with a relatively small diameter. In each case, the sensor assembly 500 substantially surrounds the wire when the wire is positioned in a recessed portion 608 of the front end 600. A wall of the front end 600, which defines the recessed portion 608 and is positioned between the sensor assembly 500 and the wire under test, may be relatively thin (e.g., 1 mm, 3 mm, 5 mm) to provide galvanic isolation while still allowing for suitable capacitive coupling. Due to the "V" shape of the recessed portion 608, thicker wires 604 have more distance than thinner ones 606 to reduce the wide range of coupling capacitance and also to reduce the environmental capacitance to be less dependent of wire diameter.

Figure 7:
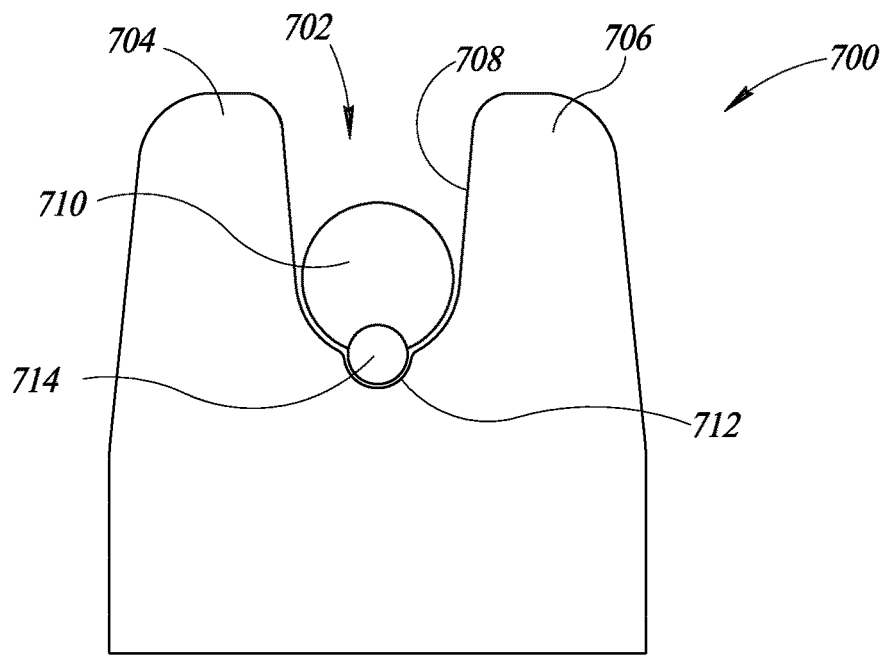
FIG. 7 an elevational view of an arcuate-shaped sensor subsystem positioned in a front end of a non-contact voltage measurement device, according to one illustrated implementation.
Figure 8:
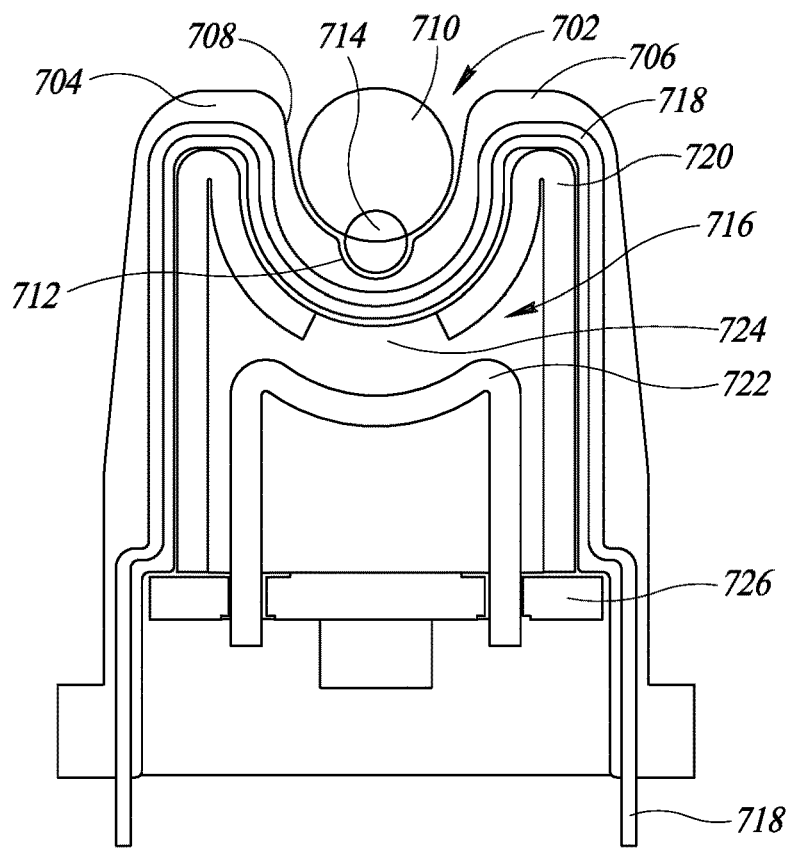
FIG. 8 is a sectional elevational view of the sensor subsystem of FIG. 7, according to one illustrated implementation.
Figure 9:
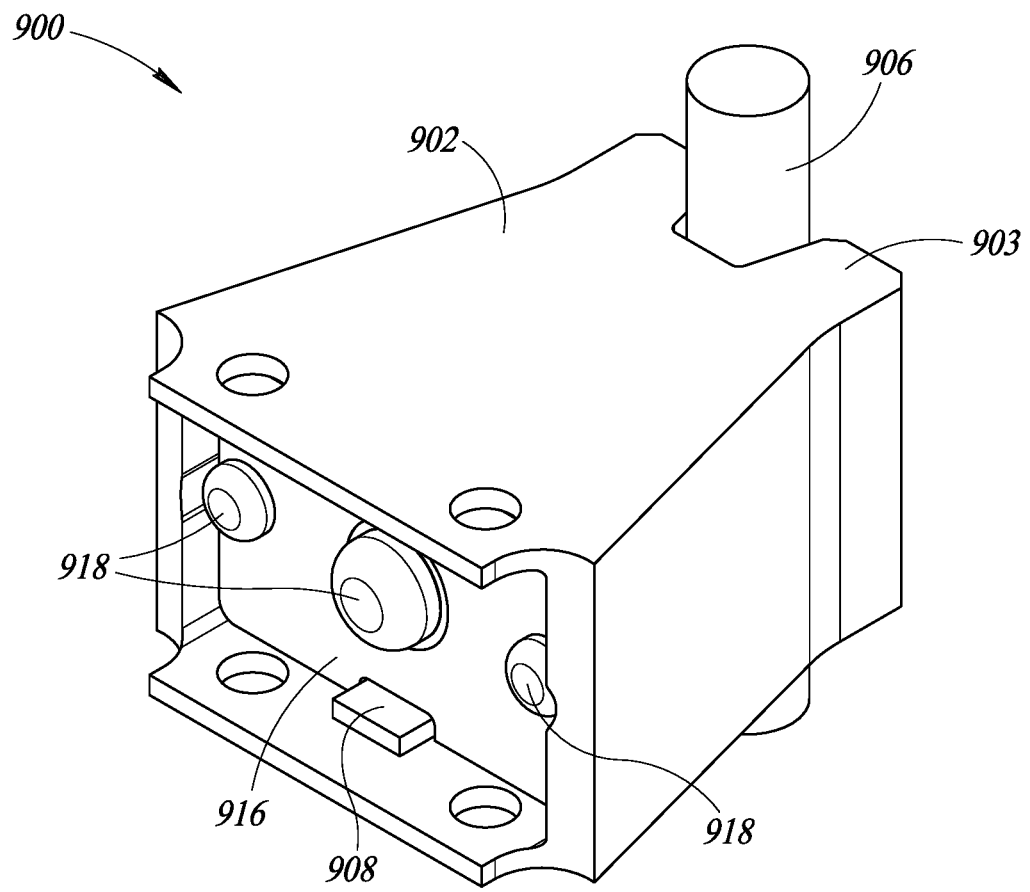
FIG. 9 is a perspective view of another implementation of a sensor subsystem that utilizes nested components.
Figure 10:
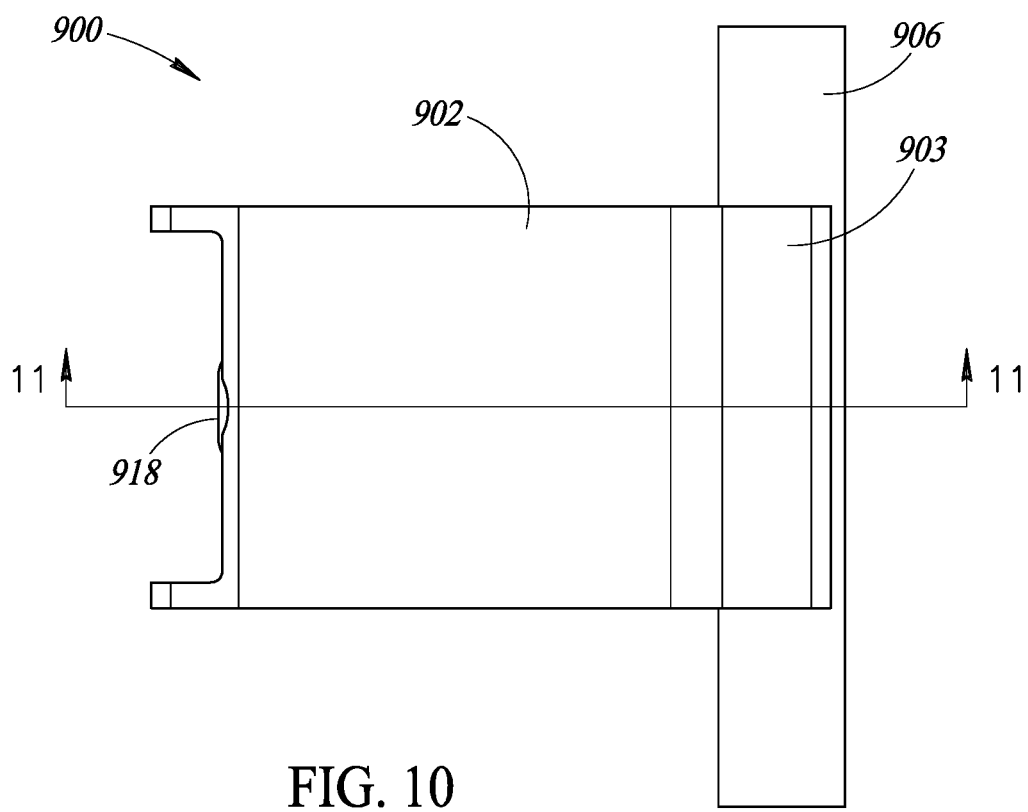
FIG. 10 is a right side elevational view of the sensor subsystem of FIG. 9, according to one illustrated implementation.

FIG. 7 shows an elevational view of an arcuate-shaped front end 700 of a non-contact voltage measurement device. FIG. 8 shows a sectional elevational view of the front end 700, which shows a sensor subsystem 716 of the front end. The front end 700 includes a housing 701 that has a recessed portion 702 defined by first and second extended portions 704 and 706. The recessed portion 702 includes a relatively large upper arcuate-shaped portion 708 which receives an insulated wire 710 having a relatively large diameter. The recessed portion 702 also includes a relatively small lower arcuate-shaped portion 712, below the portion 708, which receives an insulated wire 714 having a relatively small diameter. The sensor subsystem or assembly 716 may have a shape that generally conforms to the shape of the recessed portion 702 so that at least a portion of the sensor subsystem 716 at least partially surrounds wires having a relatively large diameter (e.g., wire 710) and wires having a relatively small diameter (e.g., wire 714).

The sensor subsystem 716 includes a reference signal layer 718 that is molded into the housing 701 (e.g., plastic housing). The reference signal layer 718 may be electrically coupled to a reference voltage source, such as the reference voltage source 130 shown in FIGS. 2-4. The reference signal layer 718 may surround at least a portion of the other components of the sensor subsystem 716, and may also surround at least some other portions (e.g., electronics) of the voltage measurement device of which the front end 700 is a part.

The sensor subsystem 716 also includes a guard layer 720 disposed below the reference signal layer 718 and above a conductive sensor 722. The guard layer 720 may include an opening or window 724 such that the guard layer does not occlude sensor 722 from the wires under test. Similar to the guard 132 shown in FIGS. 2 and 4, the guard layer 720 may be coupled to a ground of the voltage measurement device.

The guard layer 720 and the sensor 722 may each be coupled to a printed circuit assembly (PCA) 726. The PCA 726 may include various processing circuitry of the voltage measurement device, such as the circuitry shown in FIGS. 2-4 discussed above. Additionally or alternatively, the PCA 726 may include one or more connectors that allow for connection of the guard layer 720 and the sensor 722 to such circuitry.

FIGS. 9-12 show various views of a front end sensor subsystem 900 of a voltage measurement device that includes a plurality of nested components. The sensor subsystem 900 includes a housing 902 (e.g., plastic housing) that has a front portion 903 which defines a recess 904 that, in operation, receives an insulated wire 906 under test.

The sensor subsystem 900 includes the housing 902, a guard insulator 908 nested inside an interior volume of the housing, a guard 910 nested inside an interior volume of the guard insulator, a sensor insulator 912 nested inside an interior volume of the guard insulator, a sensor 914 nested inside an interior volume of the sensor insulator, and a PCA 916 electrically coupled to at least the sensor 914 and the guard 910. Fasteners 918 (e.g., screws) are provided to secure the PCA 916 and the other components to the housing 902. A reference signal layer (not shown) may be incorporated into the housing 902. For example, a reference signal layer may be molded into at least a portion of the housing 902.

Figure 11:
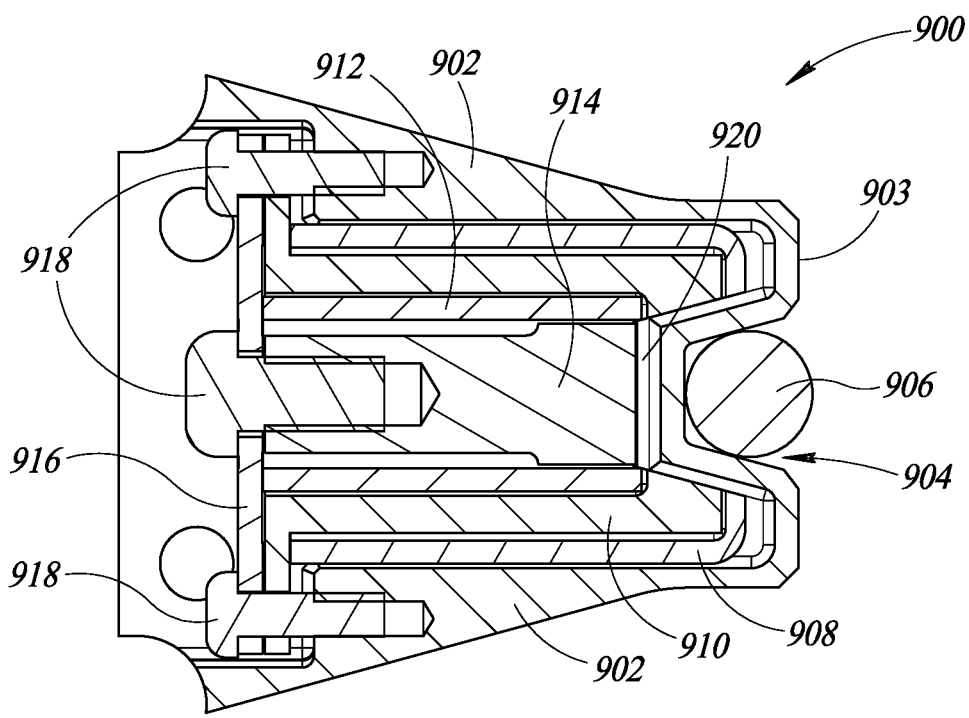
FIG. 11 is a sectional view of the sensor subsystem of FIG. 9 taken along the line 11-11 of FIG. 10, according to one illustrated implementation.
Figure 12:
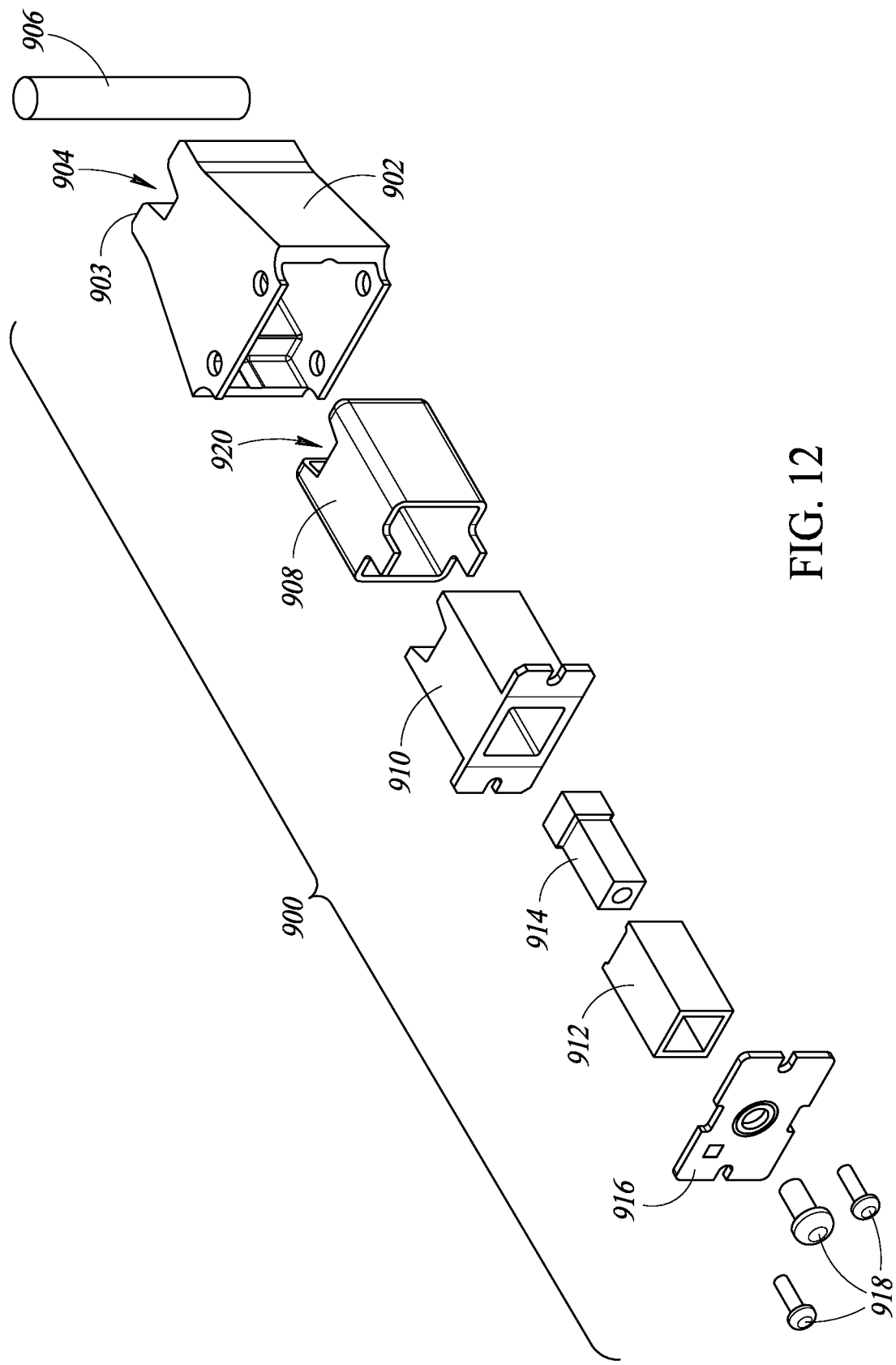
FIG. 12 is an exploded perspective view of the sensor subsystem of FIG. 9, according to one illustrated implementation.

As best shown in FIG. 11, the guard 910 may include an opening or window 920, which prevents the guard from occluding the sensor 914 from the wire 906 under test.

Figure 13:
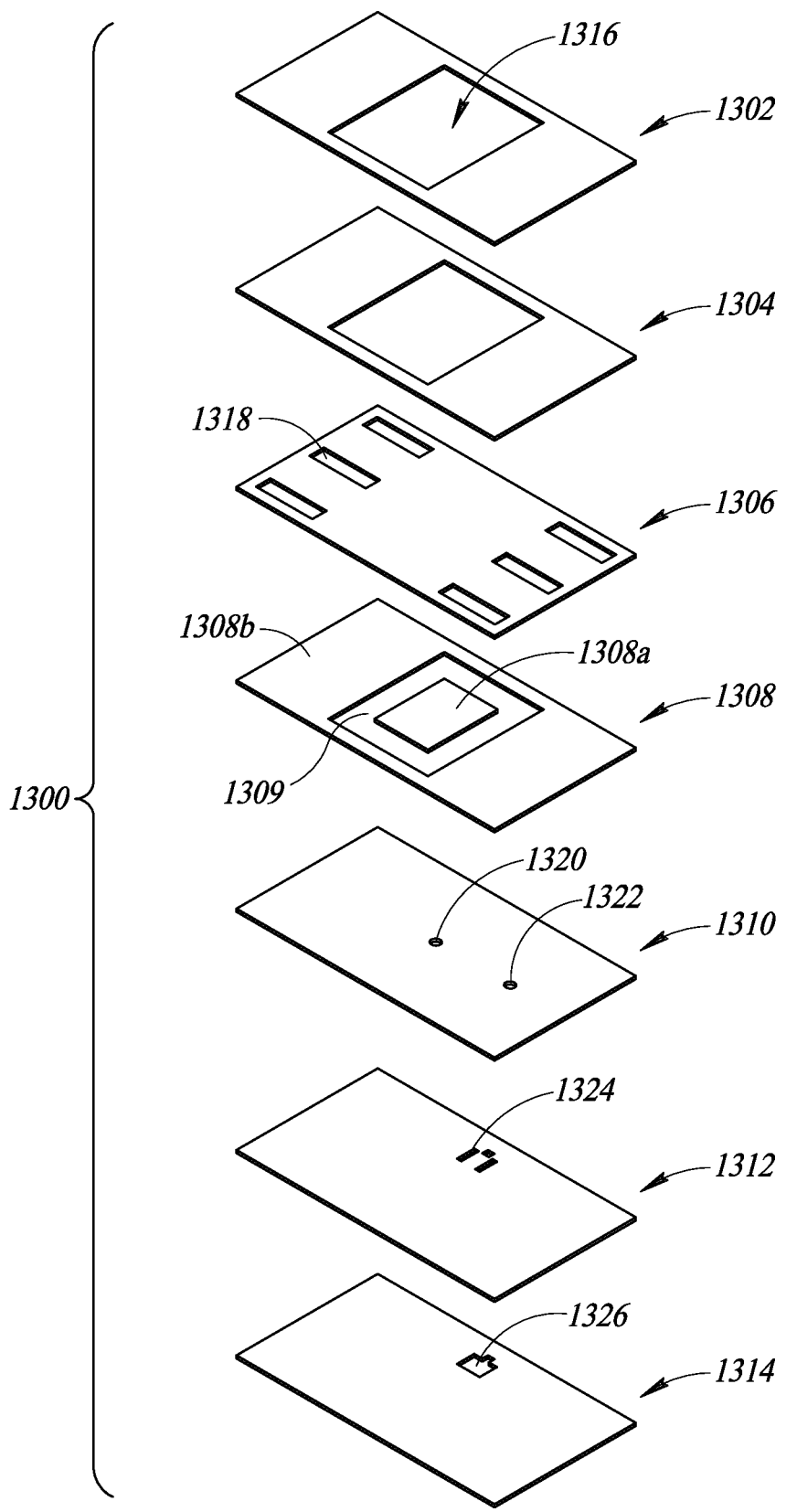
FIG. 13 is an exploded perspective view of another implementation of a sensor subsystem that utilizes flexible circuit technology.

FIG. 13 shows an exploded view of an example multi-layer flexible circuit 1300 that may be used to implement a sensor subsystem for a voltage measurement device. The flexible circuit 1300 may in at least some implementations comprise a portion of an expanded sensor subsystem, such as a sensor subsystem 1400 shown in FIGS. 14A-C and 15A-E.

The flexible circuit 1300 comprises a plurality of stacked layers. In particular, the flexible circuit 1300 includes a conductive shielding layer 1302, an adhesive backing layer 1304, a first insulation layer 1306, a conductive sensor/guard layer 1308 comprising a conductive sensor portion 1308a and a guard portion 1308b separated by a gap 1309, a second insulation layer 1310, a connector layer 1312, and a third insulation layer or cover-lay 1314. In at least some implementations, the flexible circuit 1300 may include additional or fewer layers. The conductive layers may be formed from copper or other suitable conductive material. The insulation layers may be formed from any material that blocks electrical charge, such as plastic, silicon, ceramic, etc.

The conductive shielding layer 1302 may be "free-floating" and insulated from the conductive sensor/guard layer 1308 by the first insulation layer 1306. The conductive shielding layer 1302 includes a central opening 1316 so the shielding layer 1302 does not block the sensor from a wire under test. The first insulation layer 1306 includes plurality of openings 1318 therein which allows the adhesive backing layer 1304 to contact the guard portion 1308b of the sensor/guard layer 1308 to bond the layers 1302-1308 together.

The conductive sensor portion 1308a and the guard portion 1308b of the sensor/guard layer 1308 may be electrically coupled to the connector layer 1312 through vias 1320 and 1322, respectively, in the second insulation layer 1310. The connector layer 1312 may include a pad 1324 to which a connector (not shown) may be attached (e.g., soldered). The connector may be coupled to a main circuit board of the voltage measurement device that includes the various processing circuitry discussed herein. The third insulation layer 1314 may comprise an acrylic cover-lay that include an opening 1326 sized and dimensioned to allow the connector coupled to the connector layer 1312 to pass therethrough.

Figure 14A:
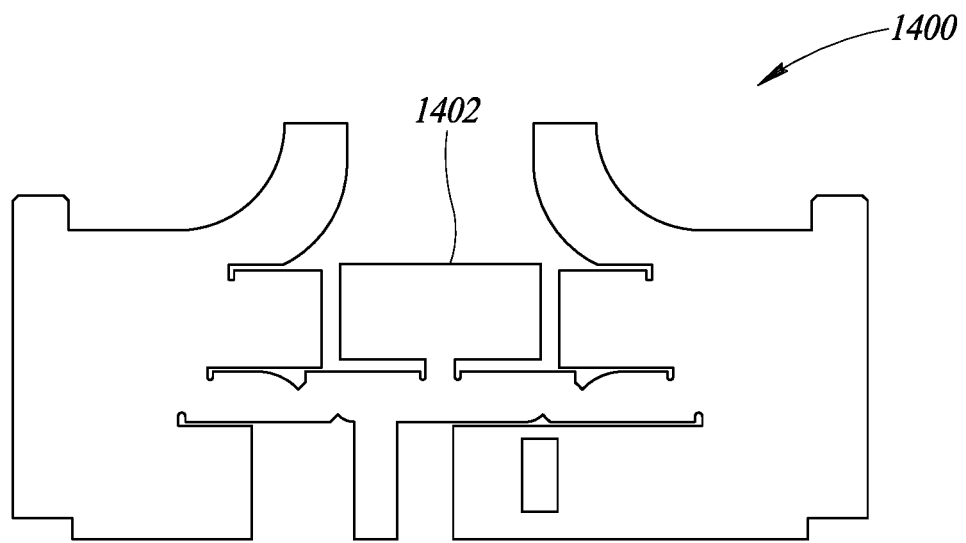
FIG. 14A is a top plan view of a sensor subsystem implemented as a multi-function flexible circuit, showing the sensor subsystem as manufactured as multiple conductive and insulative layers.
Figure 14B:
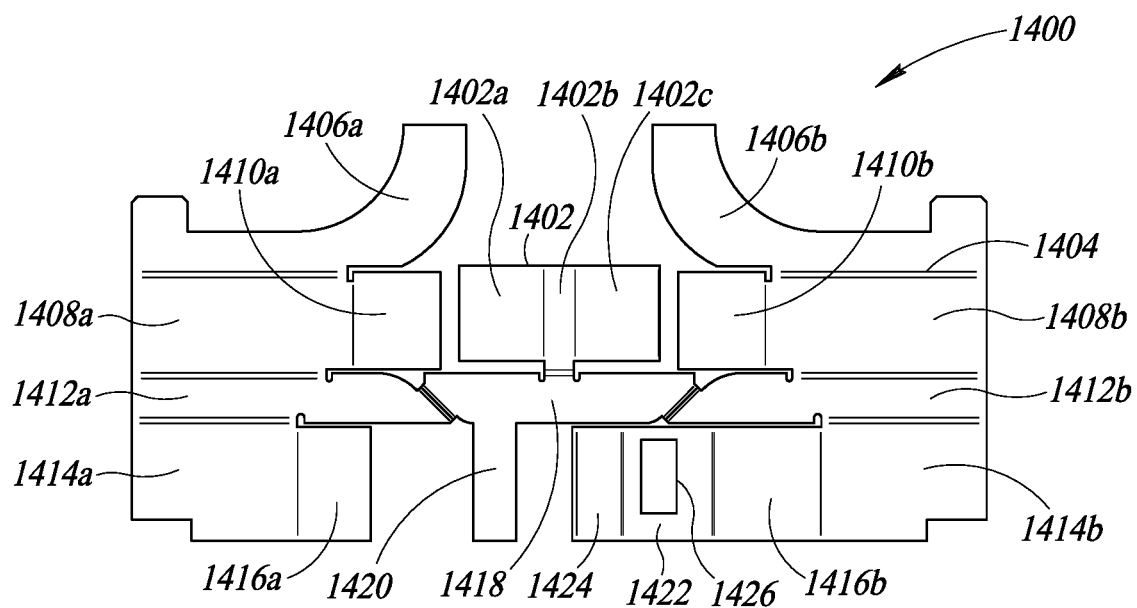
FIG. 14B is a top plan view the sensor subsystem of FIG. 14A, showing various fold lines at which the sensor subsystem may be folded or bent into a three-dimensional form for use in a non-contact voltage measurement device, according to one illustrated implementation.
Figure 14C:
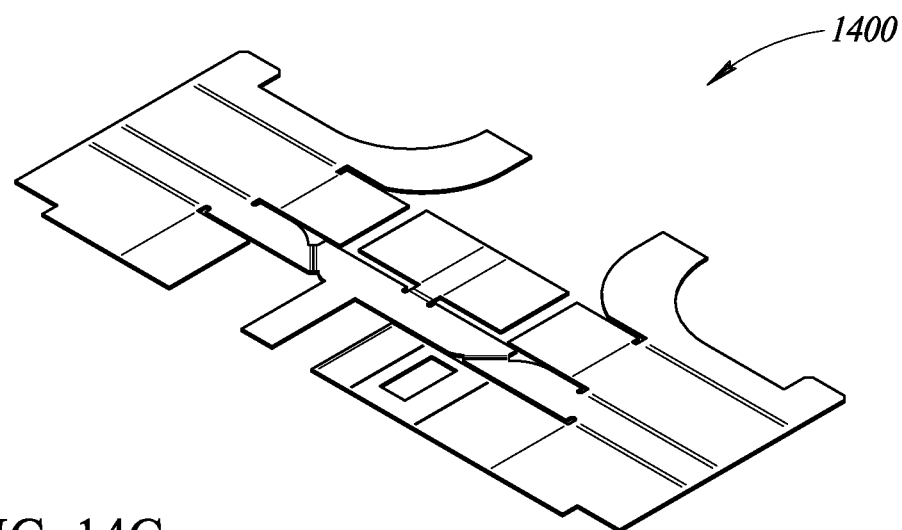
FIG. 14C is a perspective view of the sensor subsystem of FIG. 14A, according to one illustrated implementation.
Figure 15A:
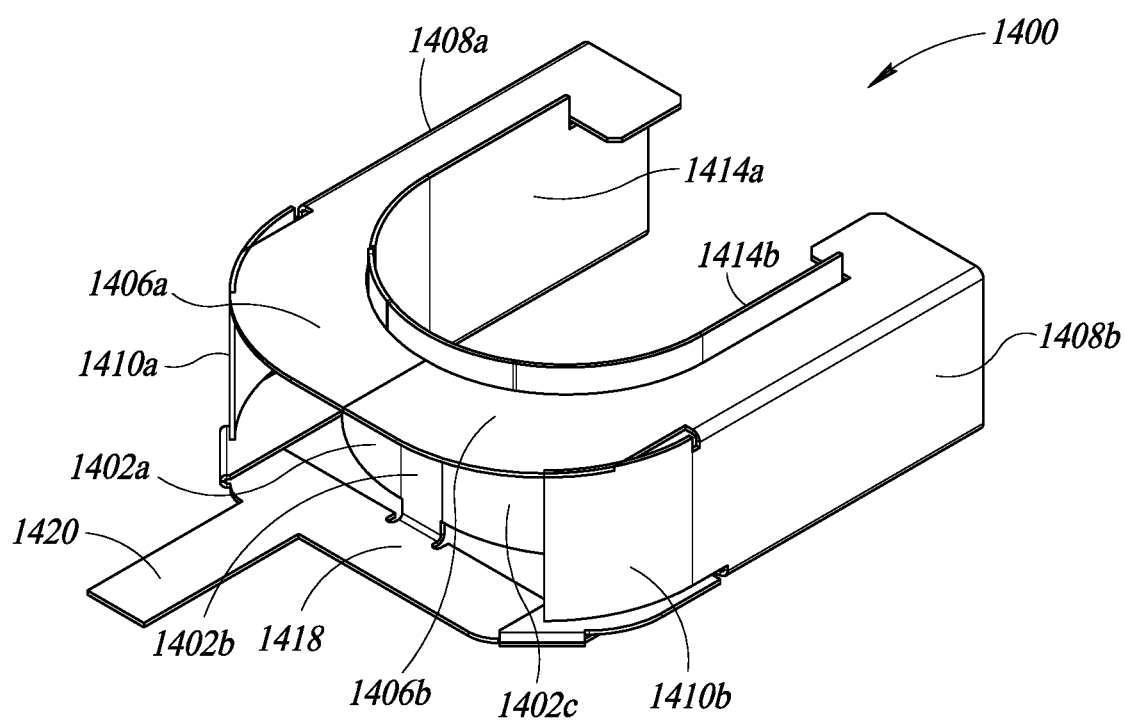
FIG. 15A is a rear perspective view of the sensor subsystem of FIG. 14A, shown after the sensor subsystem has been folded or bent along the fold lines shown in FIGS. 14B and 14C, according to one illustrated implementation.
Figure 15B:
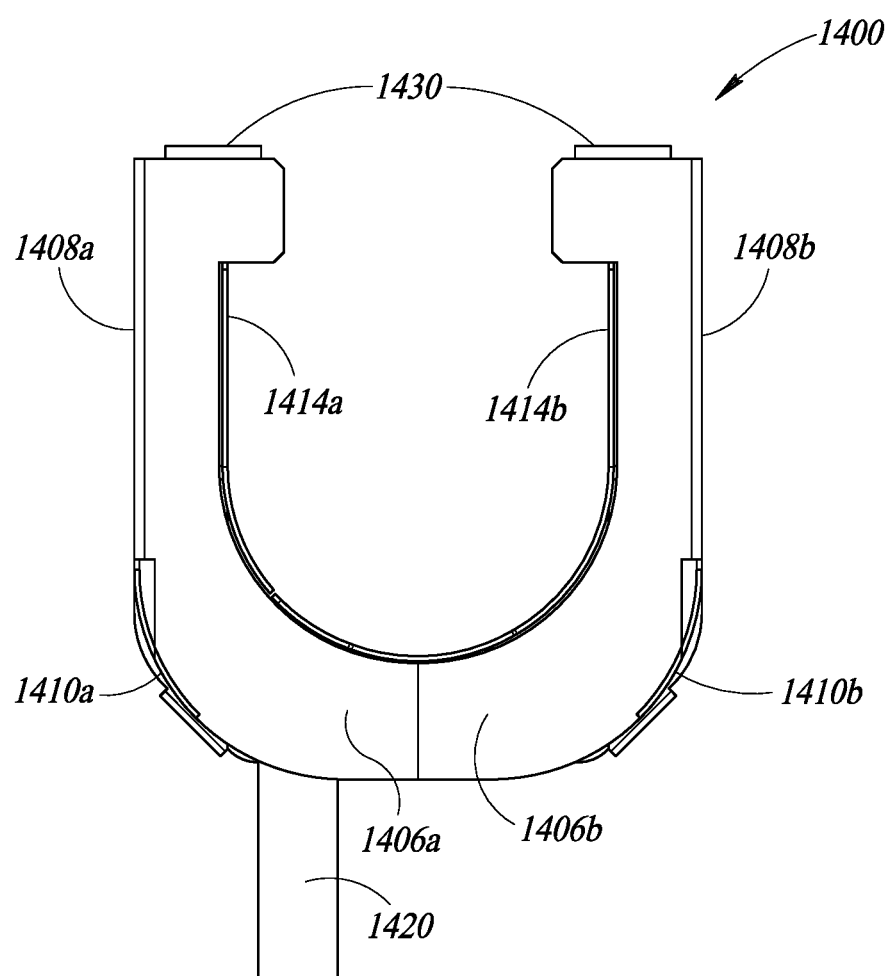
FIG. 15B is a top plan view of the sensor subsystem of FIG. 15A, according to one illustrated implementation.
Figure 15C:
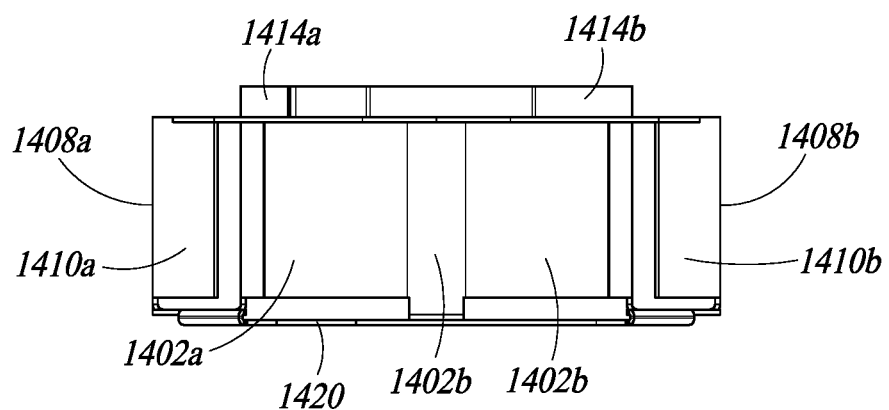
FIG. 15C is a front elevational view of the sensor subsystem of FIG. 15A, according to one illustrated implementation.
Figure 15D:
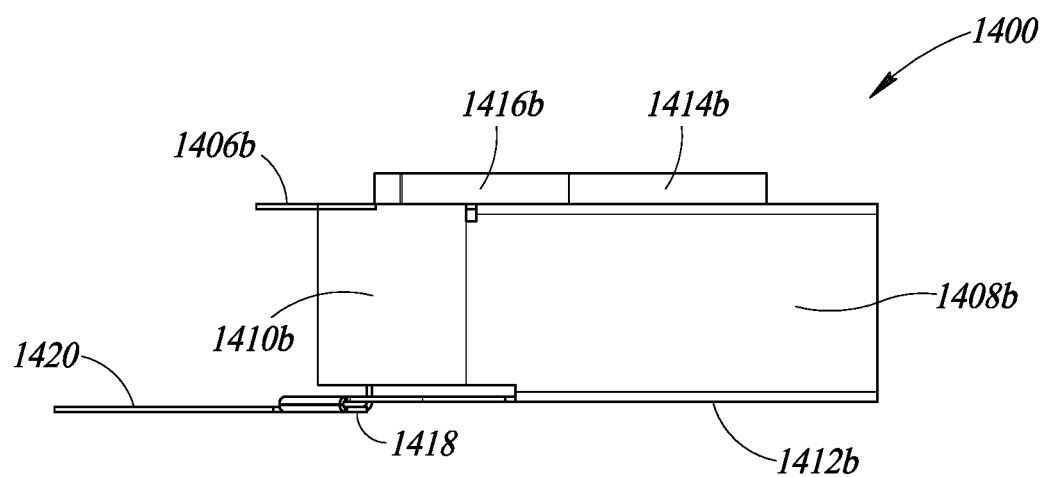
FIG. 15D is a right side elevational view of the sensor subsystem of FIG. 15A, according to one illustrated implementation.
Figure 15E:
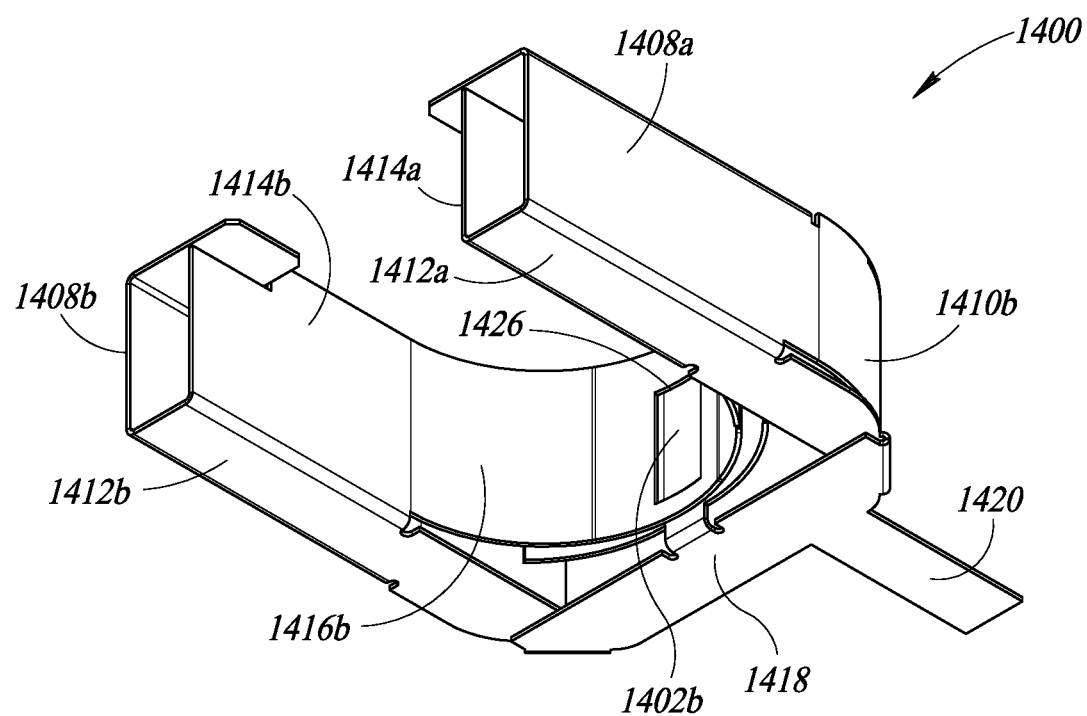
FIG. 15E is a front perspective view of the sensor subsystem of FIG. 15A, according to one illustrated implementation.

As noted above, the flexible circuit 1300 may form a portion 1402 (FIG. 14A) of the expanded flexible circuit 1400 shown in FIGS. 14A-C and 15A-E. In this example, the flexible circuit 1400 is manufactured as a flat multi-layered circuit, as shown in FIGS. 14A-14C. During manufacturing, the flexible circuit 1400 may be folded or bent along fold or tangent lines 1404 shown in FIGS. 14B and 14C into the shape shown in FIGS. 15A-15E, and positioned into a front end portion of a housing of a voltage measurement device. Several of the various portions of the flexible circuit 1400 are labeled in FIGS. 14B and 15A-E for clarity. In at least some implementations, the multi-layer flexible circuit 1400 may include an insulated reference signal layer (e.g., reference signal layer 134) disposed in one or more of the portions of the circuit. For example, in at least some implementations, the flexible circuit 1400 may include a reference signal layer disposed in some or all of the portions of the circuit except the portion 1402 which includes the conductive sensor portion 1308a (see FIG. 13).

In at least some implementations, one or more additional components 1430 (FIG. 15B) may be coupled to the flexible circuit 1400 to provide additional functionality. Such other components may include AC measurement devices, such as a non-contact current sensor (e.g., Rogowski coil, Hall Effect sensor, fluxgate sensor), one or more indicators (e.g., LEDs), illumination equipment (e.g., LED flashlight), one or more infrared (IR) sensors, etc. By including such additional components, the functionality of the flexible circuit 1400 may be extended to facilitate additional applications. Also, using multiple sensor arrangements (e.g., split signal-Reference sensor, multi-parameter sensor) is supported by a flexible sensor structure including switching or signal conditioning electronics. For example, illumination equipment may allow the voltage measurement device to illuminate a work area in which conductors are to be measured. An IR sensor may be used to detect heat profiles for circuitry under examination. A current sensor may be used to measure current, which measurement may be combined with the voltage measurement to determine other AC characteristics, such as power characteristics, phase characteristics, etc.

Figure 16:
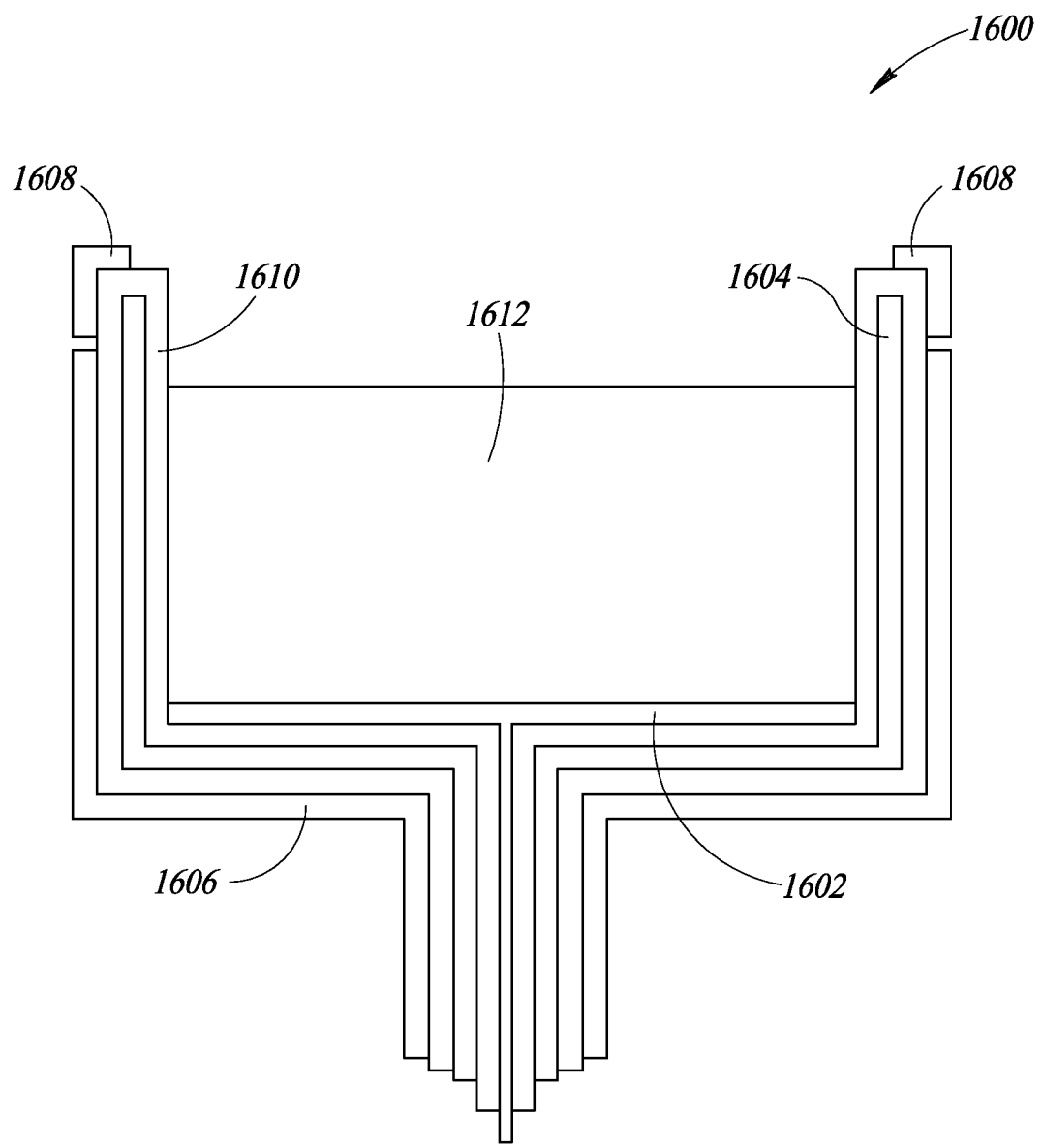
FIG. 16 is a sectional view of a sensor subsystem that includes an insulation layer made of a high permittivity material disposed above a conductive sensor, according to one illustrated implementation.

FIG. 16 shows an example sensor subsystem 1600 that includes a conductive sensor 1602, a guard 1604, a positive reference shield 1606, a negative reference shield 1608, an isolation layer 1610, and a high permittivity material 1612 (e.g., plastic) disposed between the sensor and a conductor under test. The high permittivity material 1612 disposed above the sensor 1602 focuses the field to the sensor, thereby increasing sensitivity and reducing stray effects.

The negative reference shield 1608 may be provided to compensate for the impact that the positive reference voltage ($V_R$) has on the sensor 1602 by using an inverted reference signal ($-V_R$) coupled to the negative reference shield. As an example, an adjustable inverting amplifier may be used to provide an inverted reference signal ($-V_R$) to compensate for the impact that the reference voltage ($+V_R$) has on the sensor 1602. This may be achieved by a capacitive coupling positioned proximate the sensor 1602. The capacitive coupling may be in the form of a wire, screen, shield, etc., positioned proximate the sensor. The compensation may be particularly advantageous when the insulated conductor under test has a relatively small diameter because, in such instances, the reference voltage ($V_R$) from the reference shield 1606 may have the greatest impact on the sensor 1602.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. As an example, in at least some implementations a non-contact voltage measurement device may not utilize a processor to execute instructions. For example, a non-contact voltage measurement device may be hardwired to provide some or all of the functionality discussed herein. Additionally, in at least some implementations a non-contact voltage measurement device may not utilize a processor to cause or initiate the different measurements discussed herein. For example, such non-contact voltage measurement device may rely on one or more separate inputs, such as a user-actuated button which causes measurements to occur.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, U.S. Provisional Patent Application No. 62/421,124, filed Nov. 11, 2016 and U.S. patent application Ser. No. 15/413,025, filed Jan. 23, 2017, are incorporated herein by reference, in their entirety. Aspects of the implementations can be modified, if necessary, to employ systems, circuits and concepts of the various applications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A sensor subsystem for a voltage measurement device operative to measure alternating current (AC) voltage in an insulated conductor, the sensor subsystem comprising:
   a conductive sensor disposed within a housing of the voltage measurement device, the conductive sensor selectively positionable proximate the insulated conductor without galvanically contacting the conductor, wherein the conductive sensor capacitively couples with the insulated conductor;
   a conductive internal ground guard disposed within the housing, wherein the internal ground guard at least partially surrounds the conductive sensor and is galvanically isolated from the conductive sensor, the internal ground guard sized and dimensioned to shield the conductive sensor from stray currents;
   a conductive reference shield which surrounds at least a portion of the housing and is galvanically insulated from the internal ground guard, the conductive reference shield sized and dimensioned to reduce currents between the internal ground guard and an external ground; and
   a common mode reference voltage source which, in operation, generates an alternating current (AC) reference voltage having a reference frequency, wherein the conductive internal ground guard and the conductive reference shield are electrically coupled to the common mode reference voltage source.

2. The sensor subsystem of claim 1, further comprising signal conditioning circuitry for conditioning a signal received from the conductive sensor, the conductive reference shield being electrically coupled to an input of the signal conditioning circuitry.

3. The sensor subsystem of claim 1 wherein the conductive sensor and the conductive internal ground guard are disposed in layers of a multi-layered circuit.

4. The sensor subsystem of claim 1 wherein the conductive sensor and the conductive internal ground guard are disposed in a single layer of a multi-layered circuit.

5. The sensor subsystem of claim 1 wherein the conductive sensor, the conductive internal ground guard, and the conductive reference shield are disposed in layers of a multi-layered flexible circuit.

6. The sensor subsystem of claim 1 wherein at least one of the conductive sensor, the conductive internal ground, or the conductive reference shield comprises conductive tape, a conductive sheet, a conductive plate, or a cured liquid.

7. The sensor subsystem of claim 1, further comprising:
   an insulation layer disposed between the conductive sensor and the conductive internal ground guard.

8. The sensor subsystem of claim 7 wherein the insulation layer comprises plastic, silicon, or ceramic.

9. The sensor subsystem of claim 1, further comprising a high permittivity material disposed above the conductive sensor.

10. The sensor subsystem of claim 1 wherein the conductive reference shield is molded into at least a portion of the housing of the voltage measurement device.

11. The sensor subsystem of claim 1 wherein the conductive sensor and the internal ground guard are arranged as one of stacked layers or nested components.

12. The sensor subsystem of claim 1 wherein at least a portion of the sensor subsystem comprises formed sheets, a flexible circuit, an integrated circuit chip, nested components, or a printed circuit board.

13. The sensor subsystem of claim 1, further comprising at least one of a non-contact current sensor, an infrared sensor, an indicator, or an illumination source.

14. A sensor subsystem for a voltage measurement device operative to measure alternating current (AC) voltage in an insulated conductor, the sensor subsystem comprising:
   a multi-layered flexible circuit, comprising:
      a sensor and guard layer comprising a conductive sensor portion and a guard portion galvanically isolated from the conductive sensor portion; and
      a reference shield layer that is galvanically isolated from the sensor and guard layer; and
      a common mode reference voltage source which, in operation, generates an alternating current (AC) reference voltage having a reference frequency, wherein the guard portion and the reference shield layer are electrically coupleable to the common mode reference voltage source.

15. The sensor subsystem of claim 14 wherein the multi-layered flexible circuit is foldable into a custom shape and, when in the custom shape, the multi-layered flexible circuit is positionable within a housing of a voltage measurement device.

16. The sensor subsystem of claim 14, further comprising at least one of a non-contact current sensor, an infrared sensor, an indicator, or an illumination source coupled to the multi-layered flexible circuit.

17. The sensor subsystem of claim 14, further comprising at least one of a Rogowski coil, a fluxgate sensor, or a Hall Effect sensor coupled to the multi-layered flexible circuit.

18. The sensor subsystem of claim 14, further comprising:
a shielding layer disposed above the sensor and guard layer, the shielding layer having an opening therein that is aligned with the conductive sensor portion, wherein the shielding layer is galvanically isolated from any conductive components of the sensor subsystem.

19. A sensor subsystem for a voltage measurement device operative to measure alternating current (AC) voltage in an insulated conductor, the sensor subsystem comprising:
a housing comprising an opening that defines a first interior volume;
a guard insulator disposed within the first interior volume of the housing, the guard insulator comprising an opening that defines a second interior volume;
a conductive guard disposed within the second interior volume of the guard insulator, the conductive guard comprising an opening that defines a third interior volume;
a sensor insulator disposed within the third interior volume of the conductive guard, the sensor insulator comprising an opening that defines a fourth interior volume;
a conductive sensor disposed within the fourth interior volume of the sensor insulator;
a reference shield molded into the housing; and
a common mode reference voltage source which, in operation, generates an alternating current (AC) reference voltage having a reference frequency, wherein the conductive guard and the reference shield are electrically coupled to the common mode reference voltage source.

20. The sensor subsystem of claim 19, further comprising a printed circuit assembly electrically coupled to the conductive guard and the conductive sensor.

* * * * *